United States Patent [19]
Monno et al.

[11] Patent Number: 5,699,193
[45] Date of Patent: Dec. 16, 1997

[54] APPARATUS AND METHOD FOR THE ACCURATE POSITIONING OF COMPONENTS FOR FLIP-CHIP MOUNTING

[75] Inventors: Bernd Monno, Berlin; Georg Treusch; Jens Biesenbach, both of Aachen, all of Germany

[73] Assignee: Finetech Gesellschaft Fur Elektronik Technologie mbH, Berlin, Germany

[21] Appl. No.: 674,681

[22] Filed: Jul. 2, 1996

[30] Foreign Application Priority Data

Jul. 10, 1995 [DE] Germany ............... 195 24 475.3

[51] Int. Cl.⁶ ............... G02B 27/14; G01B 11/00; H01R 43/00
[52] U.S. Cl. ............... 359/630; 356/399; 29/833
[58] Field of Search ............... 359/630, 633; 345/108; 356/399; 348/87; 29/833

[56] References Cited

U.S. PATENT DOCUMENTS

| | | | |
|---|---|---|---|
| 3,684,384 | 8/1972 | Hojo | 356/172 |
| 3,963,353 | 6/1976 | Hemstreet | 356/168 |
| 4,742,947 | 5/1988 | Coffman et al. | 228/105 |
| 5,212,880 | 5/1993 | Nishiguchi et al. | 29/739 |
| 5,311,288 | 5/1994 | Shahar | 356/375 |
| 5,311,304 | 5/1994 | Monno | 348/87 |

FOREIGN PATENT DOCUMENTS

| | | |
|---|---|---|
| 501688 | of 1992 | European Pat. Off. |
| 242320 | of 1987 | German Dem. Rep. |
| 30453 | 3/1977 | Japan .............. 356/399 |

OTHER PUBLICATIONS

"Equipment for Flip Chip Bonding", VDI/VDE Technologie–Zentrum Informationstechnik GmbH (1992).

*Primary Examiner*—David C. Nelms
*Assistant Examiner*—Ricky Mack
*Attorney, Agent, or Firm*—Felfe & Lynch

[57] ABSTRACT

For flip-chip mounting of a component with its contact surface on the contact surface of substrate, the component or the substrate is held at the free end of a lever arm which pivots around an axis, and the other part is held on a support. In a beam path between an optical device, especially a viewing device, and the contact surfaces of the two parts, a semireflecting mirror is provided to provide images of the two contact surfaces simultaneously in the optical viewing device. A first point on the one contact surface, a second point on the other contact surface, a third point on the mirror surface, and the pivot axis of the lever arm form the corners of a square. The beam path between the optical device and the semireflecting mirror is a beam path parallel to the optical axis of the optical device, the beam striking the mirror at an angle of approximately 45°. Before the part is set down onto the other part, a first lens, which focuses the beam path onto this contact surface, is located between the mirror and the contact surface of this one part, while a second lens, which focuses the beam path onto the contact surface of the other part, is provided between the mirror and the contact surface of the other part. The two lenses and the mirror are attached in an aligned state to brackets, the lenses being moved out of the pivot range of the lever arm by means of a motion device before the parts are bonded to each other.

15 Claims, 2 Drawing Sheets

APPARATUS AND METHOD FOR THE ACCURATE POSITIONING OF COMPONENTS FOR FLIP-CHIP MOUNTING

BACKGROUND OF THE INVENTION

The present invention pertains to an apparatus and method for the accurate positioning, for flip-chip mounting, of the contact surface of a component on the contact surface of a substrate, where either the component or the substrate is held at the free end of a lever arm pivoting around an axis while the other part is held on a support. In the path of the beam between an optical device, especially a viewing device, and the contact surfaces of the two different parts, a semireflecting mirror for producing images of the two contact surfaces simultaneously in the optical device is provided. A first point on the one contact surface, a second point on the other contact surface, a third point on the mirror surface, and the pivot axis of the lever arm form the corners of a square. The apparatus is especially useful for mounting electrical components according to surface mounted device (SMD) technology.

Apparatus of the type indicated above are known from DD-A1-242 320. This document describes a device in which the image of the bottom surface of an element to be mounted and the image of the mounting surface on the substrate are optically superimposed by a stationary, semireflecting mirror. The semireflecting mirror is adjusted so that the same relative position of the bottom surface of the element on the mounting surface of the substrate, as it appears in the optical superimposition, is achieved after the element has been set down onto the substrate by means of a lever arm. In this solution, the semireflecting mirror is lined up once to adjust the device and then remains unmoved thereafter. Thus, it is possible by simple means to keep the position of the mirror relative to the device constant and thus to achieve good positioning accuracy from the use of the device. This solution, however, requires that the optical or viewing device must be present on a side of the semireflecting mirror facing away from the substrate or the component, so that it is possible for the lever arm to pivot out of its starting position and into the position for setting the component down onto the substrate. Thus it is always necessary for the distance between the viewing device and the surfaces being viewed to be very large, which sharply reduces the optical resolution which can be achieved. In addition, parts of the semireflecting mirror are located in the convergent beam path in this device. As the magnification increases, these parts, i.e., glass elements, in the convergent beam path increasingly impair the resolution of the optical system.

Another device for the accurate positioning of a component for the flip-chip mounting technique is described in a paper entitled "Equipment for Flip-Chip Bonding" presented at the "Flip-Chip Technique" Seminar at the Dresden Institute of Technology, sponsored by the VDI/VDE Technologiezentrum Informationstechnik GmbH of Berlin, on Dec. 8, 1992. According to the description of this device, the bottom surface of an upper element located a certain distance above a lower element and the top surface of the lower element are projected by a semireflecting mirror and several tilted mirrors into an optical path so that a video camera can show the two images superimposed on each other. In this case, a tilted mirror, a deviating prism, and a lens directed at the upper element and lens directed at the lower element are located between the upper and the lower elements. The accuracy with which the component can be positioned on the contact surface of the substrate is determined by the accuracy with which the semireflecting mirror in particular and also the tilted mirrors and deviating prisms arranged between the upper and the lower element are adjusted. An adjustment error, especially of the angular orientation of a mirror, enters the path of the optical beam at double its original angle value. So that the upper element can be set down onto the lower element in this device, the entire optical system must be moved out of the area between the two elements. After the component has been set down onto the substrate, the optical elements are moved back into their starting position, and the optical components are moved into the area between the upper and lower elements. For the alignment and adjustment operations required to return the overall machine to its original state, it is necessary for the optical unit in particular to occupy a very precisely defined position so that it can be guaranteed that the mirrors will always be in the same position relative to the machine. This is also true, of course, with respect to the positioning of the mirrors between the upper and lower elements. It can thus be concluded that extremely high requirements are imposed on the guide mechanisms for the individual movements, and this leads in turn to very high production costs for the unit.

SUMMARY OF THE INVENTION

According to the invention, the optical errors which can be caused by the displacement of parts of the device during use can be almost completely avoided or entirely prevented. Simultaneously, a high degree of optical resolution can be achieved.

Proceeding from the state of the art described above, the path of the beam between the optical device and the semireflecting mirror is a path parallel to the optical axis of the optical device, the beam striking the mirror at an angle of 45°. Before the one part is set down onto the other part, a first lens, which focuses the beam onto the contact surface of the one part is located between the mirror and the contact surface of this one part. Between the mirror and the contact surface of the other part, a second lens is provided, which focuses the beam on the contact surface of this other part. The two lenses and the mirror are attached in the adjusted state to brackets. Before the parts are bonded to each other, only the lenses are moved out of the pivot range of the lever arm by means of a motion device.

Since only the lenses attached to their assigned brackets are moved out of the pivoting range of the lever arm after the substrate and the component to be attached to the substrate have been aligned and adjusted with respect to each other, and since the mirror, attached to its own bracket, remains stationary, the problems familiar from the state of the art are eliminated. The optical errors which result from the movement of the mirror between the individual positioning processes and which enter as double the angular error into the optical beam path can be completely excluded. In addition, the advantage is obtained that only modest requirements are imposed on the guide or pivoting device for the brackets of the lenses and the viewing device, because the requirements imposed on their positioning accuracy are lower than those imposed on the positioning accuracy of the mirror.

The motion device is preferably designed as a linear guide. With this measure, it is possible to shift or move the brackets to which the lenses are attached by simple mechanical means. Such linear guides are easy to produce mechanically but offer a high degree of precision. In addition, they are easy to install in the device and to adjust.

The linear guide is preferably designed in such a way that it moves the lenses parallel to the pivot axis around which the lever arm pivots during the mounting operation. This arrangement offers specific advantages, namely, that, in the case of large objects, several areas in a line on the contact surfaces can be observed at high magnification one after the other.

In an alternative design, the motion device can have a pivoting mechanism, on which the brackets of the lenses are supported so that they can pivot around an axis. The brackets can thus be pivoted out of the movement area of the lever arm between the individual mounting operations. In this case, the axis is preferably located on a plane perpendicular to the axis of rotation of the pivot arm. This means turned parts, which are both simple to fabricate and guarantee precise guidance, can be used.

So that the alignment of the two lenses, which must be pivoted out of the way of the lever arm during the mounting operation, with respect to each other is not changed, they are preferably attached to a common bracket. A bracket such as this or a motion device such as this is preferably a component with an angled cross section, one of the lenses being mounted on one surface of this component, the other lens being mounted on the other surface, perpendicular to the first. It also preferable for the two lenses to be similar in design. This offers the benefit that the arrangement can be designed with almost completely symmetry with respect to the optical device. The optical viewing device is also permanently connected to the bracket.

To achieve a device with high optical resolution, the two lenses are preferably mounted a very short working distance away from their assigned contact surfaces. The optical viewing device projects images from the parallel beam path onto the retina of the observer or onto the sensor of a camera.

To make it possible to move the lenses reproducibly into their base position, i.e., the position in which they are in the path of motion or working range of the lever arm so that they can be used to observe the respective contact surfaces of the substrate and of the component, stops, which are preferably adjustable, are provided, against which the brackets holding the lenses can rest when in their end positions.

As already explained above, it is preferable for the mirror, in terms of its coordinates, to be mounted permanently relative the pivot axis of the lever arm and relative to the lever arm itself. The mirror will therefore already have been precisely adjusted with respect to the lever arm and its pivot axis during the assembly of the device. For the sake of this adjustment and also for any later readjustment which may be necessary, the mirror can be mounted in its bracket by means of a precision adjustment device.

As known in and of itself, the component to be mounted is the part which is assigned to the lever arm. As a result, only a small amount of weight, in the form of the component, must be moved toward the carrier substrate.

Because of the high positioning accuracy, the device has been found suitable especially for the assembly of laser diodes on a carrier substrate, especially in the fabrication of 10-mm-wide laser diode arrays or high-power laser diode bars.

DETAILED DESCRIPTION OF THE PREFERRED EMBODIMENTS

Figure 1:
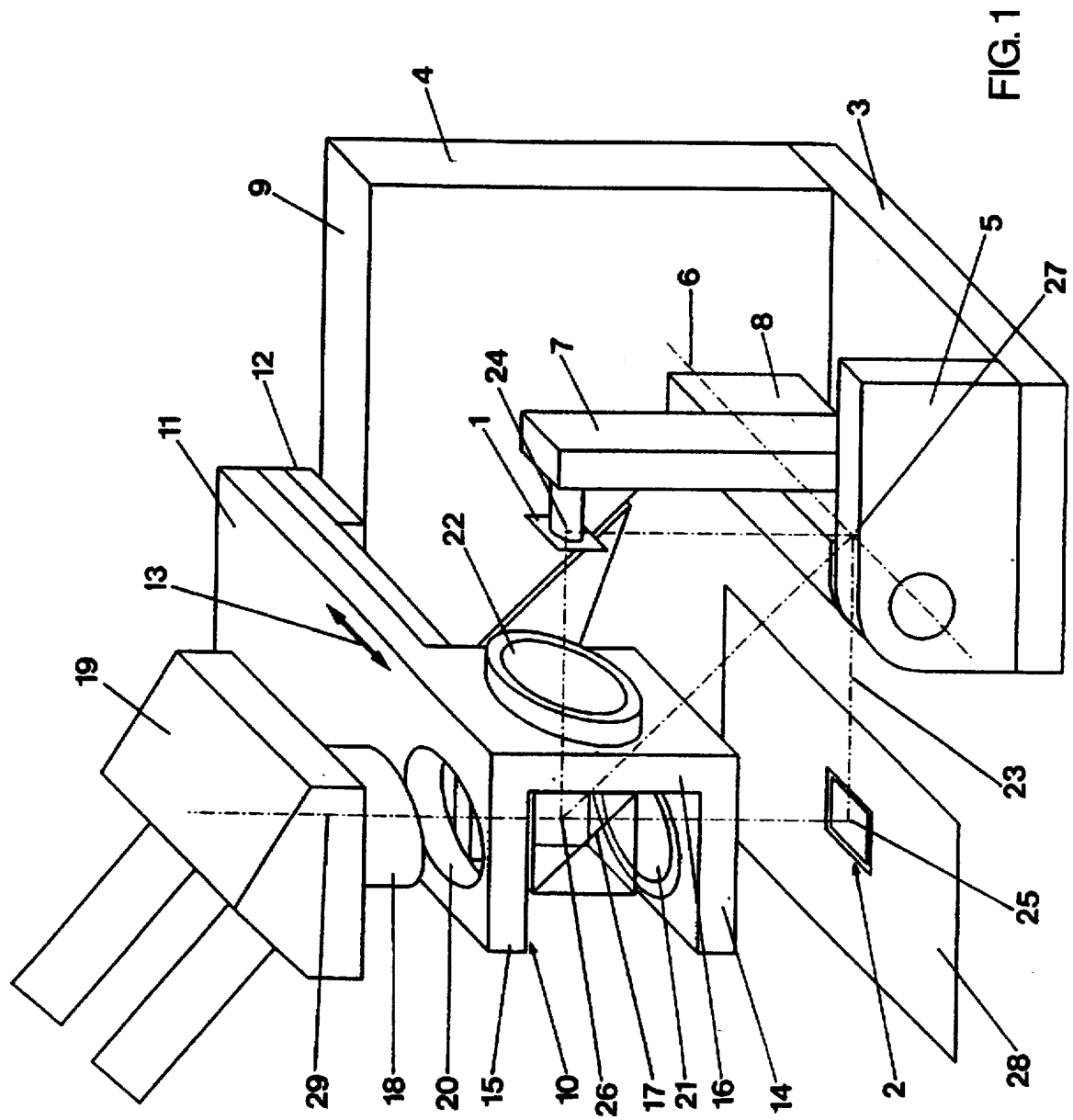
FIG. 1 is a schematic perspective of a first embodiment, with a motion device in the form of a linear guide.

The apparatus shown in FIG. 1 is used to position a component 1 accurately on a substrate 2 for flip-chip mounting. Component 1 can be a semiconductor chip which is placed on a silicon substrate 2. It is also possible, however, to position a component in the form of a laser diode on a carrier substrate 2 or a cooling element 2.

The apparatus has a plate-shaped carrier part 3, from one of the long sides of which, perpendicular to the plane of plate-shaped carrier part 3, a carrier 4 extends, whereas a bearing block 5 is provided on the side of carrier part 3 opposite carrier 4. A lever arm 7 is attached by means of an intermediate piece 8 to an axis 6, which is held pivotably and without play in bearings in bearing block 5 and carrier 4.

A U-shaped bracket 10 is mounted on top surface 9 so that its plate element 11 can move in the direction of double arrow 13 under the guidance of a linear guide 12. The U-shaped bracket has a lower mounting plate 14, an upper mounting plate 15, and a vertical mounting plate 16; vertical mounting plate 16 faces lever arm 7, whereas the open side of U-shaped bracket 10 faces the rear of the device, that is, toward the left in FIG. 1. Inside the space enclosed by mounting plates 14, 15, and 16, there is a semireflecting mirror 17, which, in this exemplary embodiment, is permanently attached to a holding device (not shown in detail) on carrier 4. Above U-shaped bracket 10, that is, above mounting plate 15, there is a system of viewing lenses in the form of a microscope 18. Upper mounting plate 15 of bracket 10 has an opening 20. Opposite opening 20 there is a first lens 21 in lower mounting plate 14. A second lens 22 is installed in vertical mounting plate 16.

As can be seen on the basis of broken lines 23 in FIG. 1, a first point 24 on the contact surface of component 1, a second point 25 on contact surface of substrate 2, a third point 26 on semireflecting mirror 17, and a fourth point 27 on axis 6 of lever arm 7 form the corners of a square; the point on the mirror surface of semireflecting mirror 17 and point 27 on axle 6 of lever arm 7 are opposite each other on a diagonal.

Semireflecting mirror 17 has a fine-adjustment device, which is not shown in detail, so that the mirror can be adjusted with respect to plane 28, on which substrate 2 is laid, and relative to carrier 4 in the four coordinates of space, so that a basic alignment can be achieved. Once semireflecting mirror 17 has been adjusted precisely in this way relative to the device, the position of mirror 17 no longer needs to be changed. The beam path of microscope 18 (microscope 18 has a parallel beam path), indicated by vertical, broken line 29, is focused through opening 20 by semireflecting mirror 17 onto plane 28 of the contact surface of substrate 2 by way of lens 21, whereas the beam reflected from mirror 17 at a right angle to vertical line 29 is focused by way of second lens 22 on the contact surface of component 1, which is positioned on lever arm 7. Because the two lenses 21, 22 are of the same design and also because they are a very short distance away from the two contact surfaces of component 1 and substrate 2, a very high degree of optical resolution can be achieved. In addition, the glass components of the optical beam divider, which takes the form of semireflecting mirror 17 in the example show here, do not degrade the image in any way, because, as can be seen in FIG. 1, they lie in the parallel beam path proceeding from microscope 18.

So that bracket 10 can be removed from the pivot range of lever arm 7 during the individual mounting operations, a linear guide 12 is provided which can be a dovetail-shaped linear guide, so that plate element 11 can be moved in the direction of arrow 13. This motion occurs parallel to axle 6 of lever arm 7. A suitable stop can be provided for the position of plate element 11 and U-shaped bracket 10 shown in FIG. 1, so that this position can be arrived at precisely again between the individual mounting steps. In the shifted-away position (not shown), it is possible, for example, for carrier 4 to serve as a rear stop, inasmuch as this shifted-away position is not critical.

Before a component 1 is positioned on substrate 2, the optical system in the form of a microscope 18, semireflecting mirror 17, and the two lenses 21, 22 is used to align substrate 2 with respect to component 1. For this purpose, it is possible, for example, to equip plane 28 with a device for moving it in the x and y directions. The holder which carries component 1 on lever arm 7 has an adjusting device for the angle of rotation around an axis perpendicular to the contact surface. After component 1 has been lined up properly with respect to the substrate with the help of microscope 18, U-shaped bracket 10 with the two lenses 21, 22 is moved by way of linear guide 12 toward the rear in the direction of arrow 12, i.e., toward carrier 4, so that bracket 10 with the two lenses 21, 22 is removed from the path of the pivoting motion of lever arm 7. Lever arm 7 is then pivoted downward around axis 6, so that component 1 is set down onto substrate 2. Then lever arm 7 is moved back into the position shown in FIG. 1, so that another component, which is to be positioned and set down onto substrate 2 or some other substrate, can be attached to lever arm 7. The essential feature in this device for setting component 1 down onto substrate 2 is that, at no time is it necessary to change the position of semireflecting mirror 17, because only the two lenses 21, 22 together with bracket 10 are pushed out of the pivoting or working range of lever 7. Whereas the small variations which can be caused by the shifting of bracket 10 holding the two lenses 21, 22 do not strongly affect the placement accuracy of the device, no such variations attributable to semireflecting mirror 17 are possible at all, because semireflecting mirror 17 always remains in its predetermined, preadjusted location. This design thus offers the possibility of highly precise, reproducible positioning and mounting of components on the various substrates in question.

Figure 2:
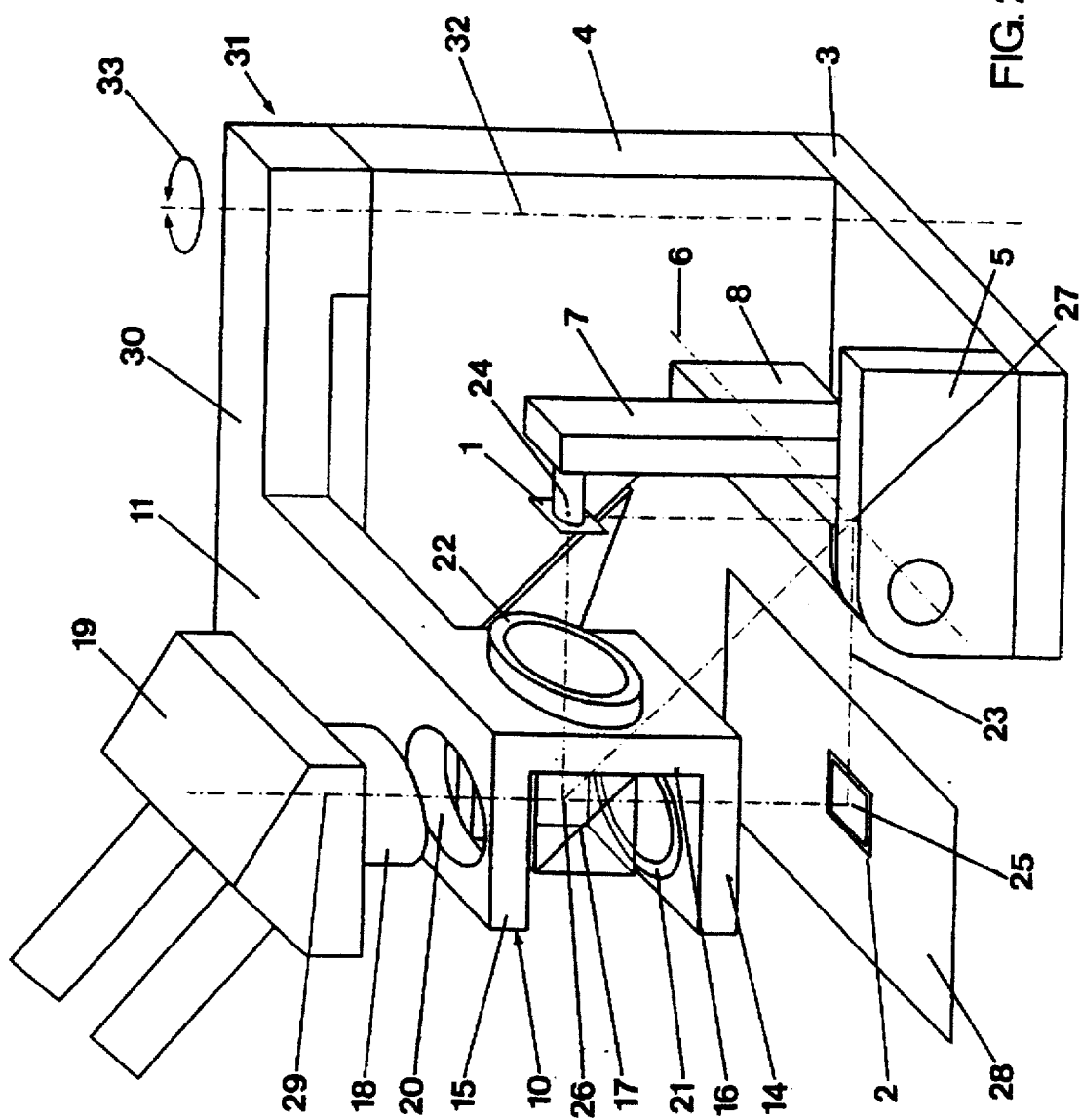
FIG. 2 is a schematic perspective of a second embodiment, in which the lens brackets are moved by a motion device designed as a pivot assembly.

FIG. 2 shows an apparatus similar to the apparatus of FIG. 1, but in this case plate element 11 is guided out of the pivoting range of lever arm 7 in a manner different from that of FIG. 1.

Insofar as the components of the device according to FIG. 2 are identical or serve essentially the same function as those of the device of FIG. 1, they are designated by the same reference numbers. These components are not described again.

In the design according to FIG. 2, plate element 11, to one end of which U-shaped bracket 10 is attached, is connected to a pivot arm 30, which extends at a right angle to plate element 11 and, in the base position shown in FIG. 2, forms an extension of carrier 4 in the upward direction. At its free end, this pivot arm 30 is supported pivotably around an axis 32 in a pivot bearing, not shown in detail. Pivot axis 32 is perpendicular to axis 6 of pivot arm 7. After the two contact surfaces, i.e., those of component 1 and of substrate 2, have been aligned with respect to each other and before lever arm 7 is pivoted, bracket 10 is swung around pivot axis 32 on pivot arm 30 in a direction 33, out of the pivot range of lever arm 7. After component 1 has been set down onto substrate 2 and lever arm 7 has been pivoted back into the position shown in FIG. 2, bracket 10 on plate element 11 and pivot arm 30 is swung back into position again. Top surface 9 of carrier 4 or a corresponding surface of pivot arm 30 can serve as guide surfaces for the process of pivoting bracket 10. The dimensions of bracket 10 and the position and the design of semireflecting mirror 17 are selected so that the bracket is able to swing by mirror 17 without colliding with it when pivot arm 30 swings around axis 32. In this embodiment as well, it is guaranteed that the semireflecting mirror always remains in its permanent position relative to carrier 4 and carrier part 3 between the individual mounting operations. As a result, the same advantages as those described in connection with FIG. 1 are again achieved.

What is claimed is:

1. Apparatus for the accurate positioning, for flip-chip mounting, of a component with its contact surface on a contact surface of a substrate, where the component or the substrate is held at the free end of a lever arm which can pivot around an axis and where the other part is held on a support, where, in the path of the beam between an optical device, especially a viewing device, and the contact surfaces of the two parts, a semireflecting mirror is provided to produce images of both contact surfaces simultaneously in the optical device, and where a first point on one of the contact surfaces, a second point on the other contact surface, a third point on the semireflecting mirror, and the pivot axis of the lever arm form the corners of a square, wherein the path of the beam between the optical device (18) and the semireflecting mirror (17) is a beam path which is parallel to the optical axis (24) of the optical device (18), striking the mirror at an angle of approximately 45°; wherein, before the one part (2; 1) is set down on the other part (1; 2), a first lens (21) is located between the mirror (17) and the contact surface of this one part (2; 1), which lens focuses the beam path on this contact surface, while a second lens (22), which focuses the beam path on its assigned contact surface, is located between the mirror (17) and the contact surface of this other part (1); and wherein the two lenses (21, 22) and the mirror (17) are mounted in an aligned state on a bracket (10), where, before the parts (1, 2) are bonded to each other, the lenses are moved out of the pivot range of the lever arm (7) by means of a motion device (12; 17, 30).

2. Apparatus according to claim 1 wherein the motion device has a linear guide (12), by means of which the lenses (21, 22) are moved out of the pivot range of the lever arm (7).

3. Apparatus according to claim 2 wherein the linear guide (21, 22) is designed in such a way that the lenses (21, 22) can be moved parallel to the pivot axis (6) of the lever arm (7).

4. Apparatus according to claim 1 wherein the motion device has a pivot device (30), which supports the bracket (10) of the lenses (21, 22), so that the bracket can pivot around an axis (32), where the axis (32) extends in a plane perpendicular to the pivot axis (6) of the lever arm (7).

5. Apparatus according to claim 1 wherein the two lenses (21, 22) and the optical device (18) are both attached to the same bracket (10).

6. Apparatus according to claim 1 wherein the first and the second lens (21, 22) are of the same design.

7. Apparatus according to claim 1 wherein each lens (21, 22) is set up near the contact surface (1, 2) to which it is assigned.

8. Apparatus according to claim 1 further comprising a stop for the reproducible positioning of the bracket (10) of the lenses (21, 22) in the position where the one contact surface is aligned with respect to the other contact surface.

9. Apparatus according to claim 1 wherein the mirror (17) is attached permanently in terms of its coordinates with respect to the pivot axis (6) and the lever arm (7).

10. Apparatus according to claim 1 further comprising a support part (3) with a bearing block (5), which supports the lever arm (7), and with a carrier (4) for the motion device (11; 12, 30) and the bracket (10) for the semireflecting mirror (17).

11. Apparatus according to claim 1 wherein the mirror (17) is mounted in its own holder by means of a fine-adjustment device.

12. Apparatus according to claim 1 wherein the component (1) is the part which is held on the lever arm (7).

13. Apparatus according to claim 1 wherein the optical viewing device (18) is a microscope with a parallel beam path.

14. Apparatus according to claim 1 wherein the optical viewing device (18) is a lens system, which projects the images of the contact surfaces from the parallel beam path onto a camera sensor.

15. Apparatus for mounting of a component having a contact surface on a contact surface of a substrate, said apparatus comprising a support member, means for holding a substrate having a contact surface at a first point which is fixed relative to said support member, a lever arm pivotable about a pivot axis which is fixed relative to said support member, said lever arm having a free end which carries a component having a contact surface at a second point, said lever arm being pivotable through 90 degrees to move said contact surface of said component from said second point to said first point, an optical device having a beam path which passes through a third point to said first point, said first point, said second point, said third point, and said pivot axis forming the corners of a square, a semireflecting mirror having a surface on which said third point is located, said semireflecting mirror being positioned to simultaneously produce images of both contact surfaces in the optical device, a first lens located between the semireflecting mirror and the first point, first lens focusing said beam path on the contact surface of the substrate, a second lens located between the semireflecting mirror and second point, said second lens focussing said beam path on the contact surface of the component, and bracket means to which said semireflecting mirror, said first lens, and said second lens are mounted in an aligned state, said bracket means being movable out of said beam path when said lever arm pivots.

* * * * *